United States Patent [19]

Ahmad et al.

[11] Patent Number: 5,436,412
[45] Date of Patent: Jul. 25, 1995

[54] INTERCONNECT STRUCTURE HAVING IMPROVED METALLIZATION

[75] Inventors: Umar M. U. Ahmad; Ananda H. Kumar, Both of Hopewell Junction; Eric D. Perfecto; Chandrika Prasad, both of Wappingers Falls; Sampath Purushothaman, Yorktown Heights; Sudipta K. Ray, Wappingers Falls, all of N.Y.

[73] Assignee: International Business Machines Corporation, Armonk, N.Y.

[21] Appl. No.: 102,027

[22] Filed: Aug. 3, 1993

Related U.S. Application Data

[63] Continuation-in-part of Ser. No. 968,930, Oct. 30, 1992.

[51] Int. Cl.⁶ .............................................. H06K 1/02
[52] U.S. Cl. .................................... 174/265; 174/257; 174/261; 174/262
[58] Field of Search ............... 174/250, 251, 255, 257, 174/261, 262, 265

[56] References Cited

U.S. PATENT DOCUMENTS

| | | | |
|---|---|---|---|
| 3,959,874 | 6/1976 | Coucoulas | 29/577 |
| 4,371,744 | 2/1983 | Badet et al. | 174/68.5 |
| 4,751,349 | 6/1988 | Kim et al. | 174/68.5 |
| 4,880,684 | 11/1989 | Boss et al. | 428/209 |
| 5,175,609 | 12/1992 | DiGiacomo et al. | 257/766 |
| 5,196,251 | 3/1993 | Bakhru et al. | 428/76 |
| 5,219,639 | 6/1993 | Sugawara et al. | 428/209 |
| 5,235,139 | 8/1993 | Bengston et al. | 174/257 |
| 5,291,374 | 3/1994 | Hirata et al. | 361/760 |

FOREIGN PATENT DOCUMENTS

| | | | |
|---|---|---|---|
| 0380289A3 | 1/1990 | European Pat. Off. | H01L 23/498 |
| 0504411A1 | 9/1991 | European Pat. Off. | H01L 23/50 |
| 0536418A1 | 4/1992 | European Pat. Off. | H01L 23/13 |
| 60138948 | 12/1983 | Japan | H01L 23/48 |
| WO92/20100 | 7/1991 | WIPO | H01L 23/498 |

OTHER PUBLICATIONS

IBM Research Disclosure, "Combination Process for Final Metal Lines and Metal Terminals", Disclosed anonymously; Oct. 1992, No. 342, p. 753.
IEEE, "Production of MCP Chip Carriers", M. E. Williams, 0569-5503/90-0000-0408 May, 1990.

Primary Examiner—Leo P. Picard
Assistant Examiner—L. Thomas
Attorney, Agent, or Firm—Ira David Blecker

[57] ABSTRACT

An electrical interconnect structure for connecting a substrate to the next level of packaging or to a semiconductor device. The interconnect structure includes at least two layers of polymeric material, one of the layers having a capture pad and the second of the layers having a bonding pad electrically connected to the capture pad. The bonding pad and the second layer of polymeric material are at the same height so that the bonding pad is level with the second layer of polymeric material. Finally, there is a cap of electrically conducting metallization on the bonding pad and extending beyond the second layer of polymeric material. The cap is of a different composition than the bonding pad.

30 Claims, 5 Drawing Sheets

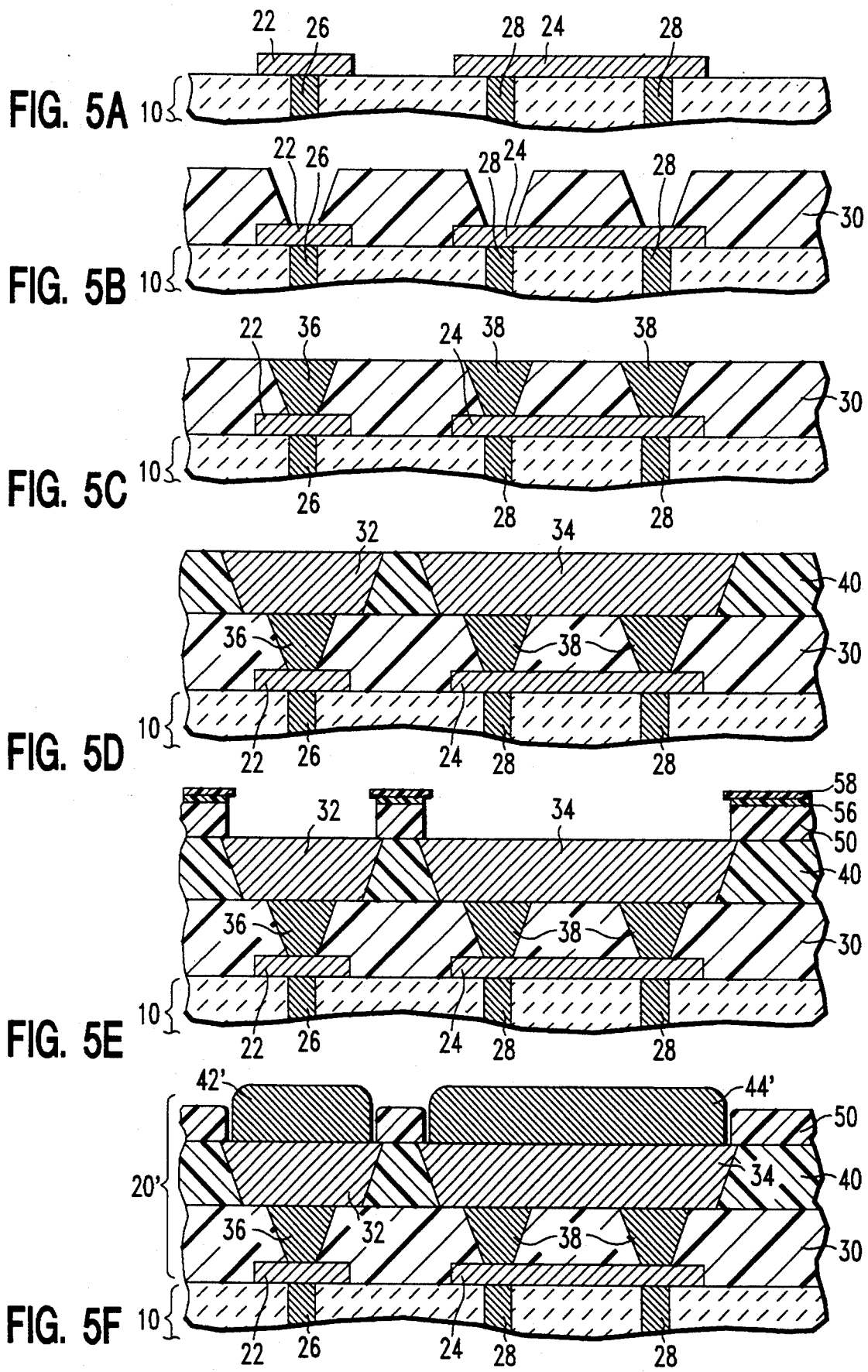

INTERCONNECT STRUCTURE HAVING IMPROVED METALLIZATION

RELATED U.S. APPLICATIONS

This is a Continuation-in-Part of prior application Ser. No. 07/968,930, filed Oct. 30, 1992.

BACKGROUND OF THE INVENTION

The present invention relates to the field of electronics packaging and, more particularly, relates to structures for making connections between a semiconductor device carrier and the next level of packaging or between the semiconductor device carrier and the semiconductor device.

In the microelectronics environment, there is a need for high density, high strength packaging to provide interconnection between semiconductor devices and connection from the devices to the electrical power supply. The electrical properties which are desirable include a highly conductive medium in a highly insulative carrier medium having a low dielectric constant.

As to the top surface of the package which contains pads for bonding to a semiconductor device or engineering change pad, the metallization is chosen so as to be best for the pads and the underlying wiring features. This can lead to increased electrical resistance, for instance. Since the pads and the underlying wiring features may have different metallization needs, there is no metallization that ideally suits both needs. The resultant metallization is often a compromise.

Thermally, the package must withstand not only the operating environment but also the thermal excursions encountered during the processing and fabrication of the part. Mechanically, it is preferable to have a substrate package which can withstand chip and pin joining stresses related to interconnecting with the next level of packaging. Moreover, future packages will include pad-on-pad connections along with pin connections on the same substrate for interconnecting with the next level of packaging. The functions of each type of connection may be segregated so that, for example, the pins may be utilized for supplying power while the pads may supply the signals.

Boss, et al. U.S. Pat. No. 4,880,684 disclose an interconnection structure consisting of a capture pad, a polymeric stress relief layer, and a bonding pad for attaching a pin. This reference does not consider the enhanced mechanical requirements for pad-on-pad connections.

Pad-on-pad connections have tougher mechanical requirements so the interconnection structure needs to be stronger to accommodate this type of joining. Too, the metallization on the bottom of the substrate needs to be designed so that the metallization for pad-on-pad and pin joining is manufactured at the same time. The resulting interconnect structure must also be resistant to corrosion.

Accordingly, it is a purpose of the present invention to have an interconnect structure wherein the metallization for the chip attach pads, engineering change pads, and the underlying wiring features can be chosen to ideally provide for the needs of each of these pads and features.

It is another purpose of the present invention to have an interconnect structure that utilizes both pin and pad-on-pad connections.

It is another purpose of the present invention to have an interconnect structure where the substrate metallization structure has been strengthened so as to handle the tougher mechanical requirements of pad-on-pad connections.

It is another purpose of the present invention to have an interconnect structure which has been designed so that the metallization for the pin and pad-on-pad connections can be made at the same time.

It is yet another purpose of the present invention to have an interconnect structure which has been designed so as to meet stringent mechanical requirements while also being resistant to corrosion.

These and other purposes of the present invention will become more apparent after referring to the following description in conjunction with the accompanying drawings.

BRIEF SUMMARY OF THE INVENTION

The purposes of the invention have been achieved by providing an electrical interconnect structure comprising:

at least one electrically conducting feature on a surface of the substrate;

a cap of electrically conducting metallization on the electrically conducting feature wherein said cap only partially covers said electrically conducting feature; and a layer of polymeric material deposited on the surface of the substrate, on the electrically conducting feature not covered by said cap and around said cap, wherein said cap extends beyond the layer of polymeric material.

In a second aspect of the invention there is provided an electrical interconnect structure comprising:

at least one electrically conducting capture pad on the surface of the substrate;

a first layer of polymeric material disposed on the surface of the substrate and the capture pad;

at least one electrically conducting bonding pad disposed on the first layer of polymeric material;

an electrically conducting stud connecting the capture pad and bonding pad through the first layer of polymeric material;

a second layer of polymeric material disposed on the first layer of polymeric material and around the bonding pad, the polymeric material being at the same height as the bonding pad;

a cap of electrically conducting metallization on the bonding pad extending beyond the second layer of polymeric material, the cap being of a different composition than the bonding pad.

BRIEF DESCRIPTION OF THE DRAWINGS

FIGS. 5A to 5F are cross sectional views illustrating the method for forming the second embodiment of the invention.

DETAILED DESCRIPTION OF THE INVENTION

Figure 1:
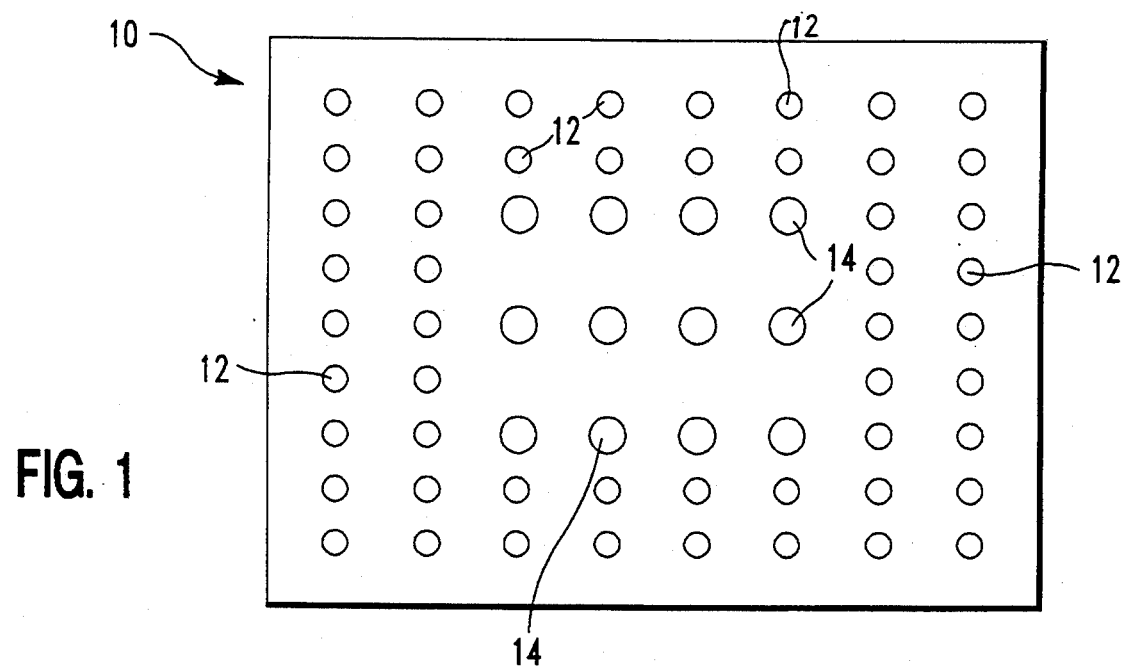
FIG. 1 is a plan view of the connector side metallurgy of a substrate showing an array of pin pads and pad-on-pad pads.

Referring to the Figures in more detail, and particularly referring to FIG. 1, there is shown the connector side metallurgy on a substrate 10. The substrate 10 has a plurality of pads 12 for making pad-on-pad connections and a plurality of pads 14 for making pin or other connections such as solder ball connections.

In one preferred arrangement of the pads, pads 14 are located within the central portion of the substrate 10 while pads 12 are located around the periphery of the substrate 10. In this manner, pad connectors (not shown) can easily make contact with the pads 12 from the side. The location of pads 14 is not so critical since they will have pins secured thereto.

It is an advantageous effect of the present invention that the different types of pads can perform different functions. That is, pads 12 can interconnect for the transmission of signals while pads 14 can interconnect for the transmission of power. This particular arrangement is not necessary to the present invention but it is an advantage of it.

As is noted from FIG. 1, pads 12 typically (and preferably) are smaller than pads 14. In fact, pads 12 may be on the order of 100 to 200 microns while pads 14 may be on the order of 1500 to 2000 microns in size. Thus, the number of pads 12 may be clustered more densely than pads 14.

The substrate material is unimportant to the present invention. Accordingly, the material may be ceramic, glass, glass-ceramic, or any known polymeric material useful in the electronics industry for manufacturing circuit boards, printed wiring boards and other electronics substrates. For purposes of illustration, substrate 10 as shown in the Figures is a ceramic material.

Figure 2:
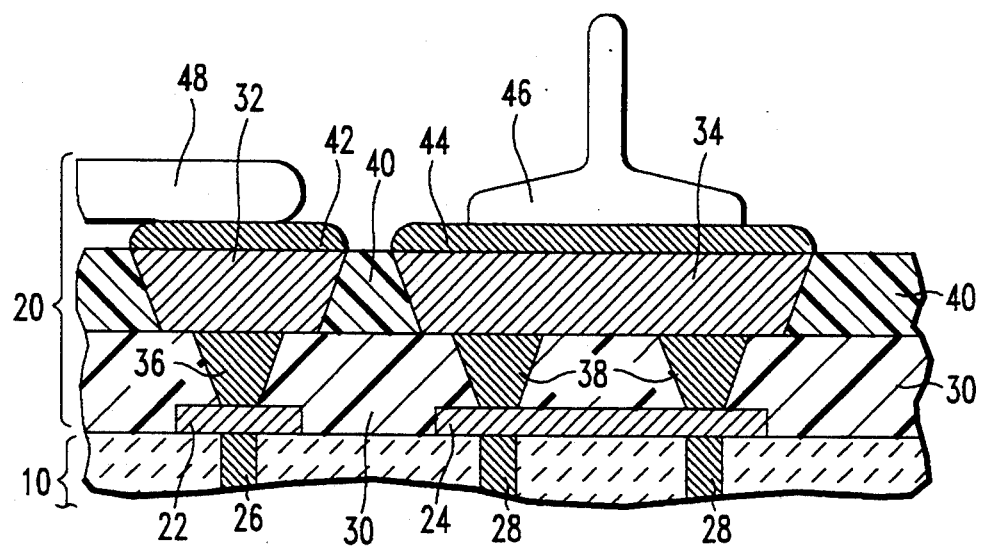
FIG. 2 is a cross sectional view of a first embodiment of the invention.

Referring now to FIG. 2, there is an electrical interconnect structure 20 for connecting a substrate 10 to the next level of packaging. The next level of packaging may be a board or flex connector or some other form of connector. For clarity, the view of substrate 10 is with the connector side up.

The interconnect structure will now be described. On substrate 10 there is situated electrically conducting capture pads 22, 24. It will be noted that one via 26 emanating from substrate 10 terminates at capture pad 22 while there are two vias 28 emanating from substrate 10 that terminate at capture pad 24. Since capture pad 22 in this embodiment is for signal transmission, one via 26 is sufficient to carry the signal. On the other hand, since capture pad 24 in this embodiment is for power transmission, two (or more) vias 28 are desirable. Of course, the invention is applicable whether there is one, two or more vias.

Situated over capture pads 22, 24 is a layer of an insulator material such as polymeric material 30. The particular polymeric material is also not important for the present invention although polyimides are preferred for the present invention. On top of polymeric material 30 are electrically conducting bonding pads 32,34 which are in electrical contact with capture pads 22 and 24, respectively. As will be noted, bonding pad 32 is smaller than bonding pad 34. There is at least one electrically conducting stud 36 connecting bonding pad 32 with capture pad 22 and at least one electrically connecting stud 38 connecting bonding pad 34 with capture pad 24. As shown in FIG. 2, there are two such studs 38.

Then, there is a second layer of an insulator material such as polymeric material 40 disposed or deposited on the first layer of polymeric material 30 and around the bonding pads 32, 34. The polymeric material 40 has been processed so as to be at the same height as the bonding pads 32, 34. While first layer of polymeric material 30 has been found to be useful for absorbing stress as taught by Boss et al. U.S. Pat. No. 4,880,684, second layer of polymeric material 40 has been found useful by the present inventors for sealing the bonding pads 32, 34 against corrosion of the edges of the bonding pads 32, 34 due to contact with the surrounding atmosphere. Again, the material for second layer of polymeric material 40 is unimportant but polyimides are preferred.

Lastly, on top of bonding pads 32, 34 is a cap 42, 44 of electrically conducting metallization. Each of the caps 42, 44 extends beyond the second layer of polymeric material 40. Each of the caps 42, 44 are typically of a different composition than that of the bonding pads 32, 34. Finally, the caps 42, 44 have been processed so as to be at the same height.

Due to the sealing nature of second polymeric layer 40 around bonding pads 32, 34, the metallurgy for the capture pads 22, 24, studs 36, 38 and bonding pads 32, 34 may be chosen to meet the stringent mechanical requirements of the interconnect structure according to the present invention as well as to satisfy any electrical requirements. Thus, capture pads 22, 24 and bonding pads 32, 34 may comprise, for example, a chromium adhesion layer followed by phased-in chromium/copper and then all copper. The bonding pads 32, 34 are principally or mostly copper which has the dual advantage of excellent conductivity as well as absorbing the stress from bonding. Studs 36, 38 may comprise, for example, copper. The most important metallization is for caps 42, 44 which, due to the requirement that the metallization for both pin and pad-on-pad connections are processed simultaneously, must withstand the requirements of pin brazing, pad-on-pad connections and corrosion protection. In this embodiment of the invention, it is preferred that the metallization for caps 42, 44 is sequential layers of nickel(P) or cobalt(P) and then gold. (Ni(P) and Co(P) are nickel and cobalt, respectfully, with small amounts of phosphorous.) Ni(P) and Co(P) and gold are deposited by electroless plating and are a few microns thick. Alternatively, electron beam evaporated Ni or Co and Au can also be used to produce these caps.

Also shown in FIG. 2 are pin 46 brazed to cap 44 and bonding pad 34 and external pad 48 (external meaning that it is not part of the interconnection structure 20 or substrate 10) mated with cap 42 and bonding pad 32 to form the pad-on-pad connection. The external pads could be, for example, the pads on a flexible connector such as TAB, flat cables, etc. There will usually be a plurality of such pins 46 and external pads 48.

Figure 3:
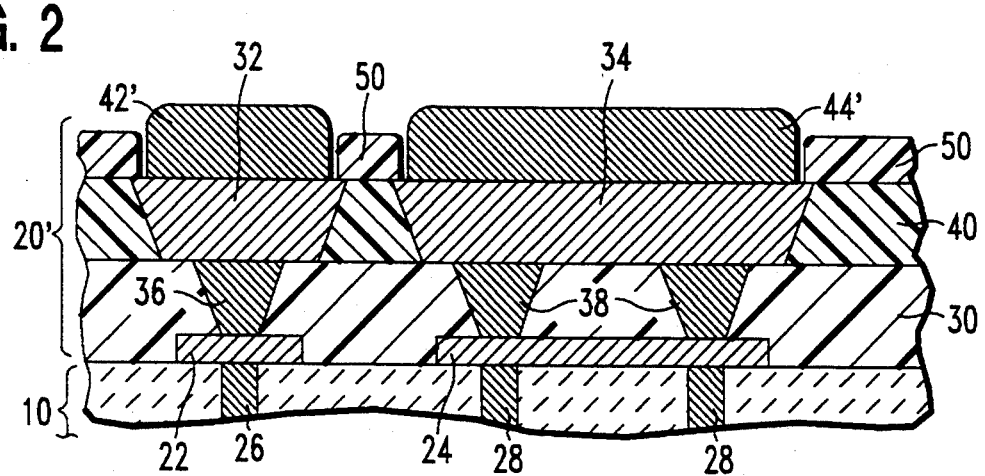
FIG. 3 is a cross sectional view of a second embodiment of the invention.

Referring now to FIG. 3, there is shown an alternative embodiment of the present invention. It should be understood that like numbers in FIGS. 2 and 3 refer to like elements. Thus, substrate 10 has situated thereon an interconnection structure 20'. Interconnection structure 20' comprises capture pads 22, 24, studs 36, 38 and bonding pads 32, 34. There is also first polymeric layer 30 and second polymeric layer 40. Interconnection structure 20' further comprises caps of metallization 42', 44' which are similar in function to previously-described caps 42, 44 of FIG. 2. However, caps 42', 44' are thicker and comprise a different metallization. A final component of interconnection structure 20' is a third layer of an insulator material such as polymeric material 50 which, like first and second layers of polymeric material, may be any of several suitable polymeric materials but which preferably is a polyimide. The third layer of polymeric material 50, as can be seen, is disposed or deposited on the second layer of polymeric material 40 and surrounds caps 42', 44'. The caps of metallization 42', 44' must extend somewhat beyond the height of third polymeric material 50 so as to allow pin and pad-on-pad connections.

Preferred metallization for caps of metallization 42', 44' are sequential layers of Cr/Cu/Ti/Mo/Au, Cr/Ni/Au, Cr/Ti/Au or Cr/Co/Au. The advantage of this metallization over that of FIG. 2 is that the gold overlayer can be thicker and harder so as to better handle sliding contacts.

Pins (or other connection apparatus) and pads for pad-on-pad connections are not shown in FIG. 3 although it should be understood that in practice they will be present.

Figure 4A:
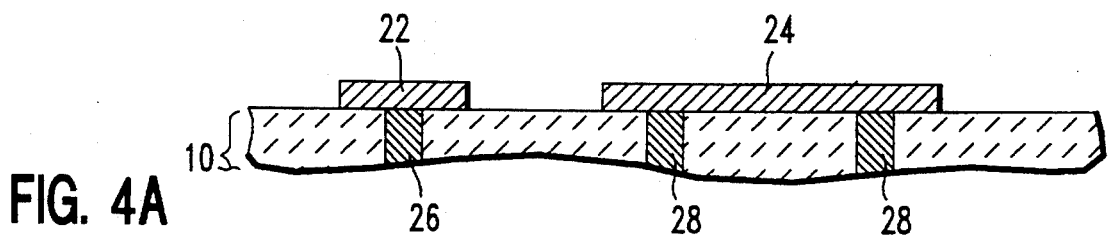
FIGS. 4A to 4E are cross sectional views illustrating the method for forming the first embodiment of the invention.
Figure 4B:
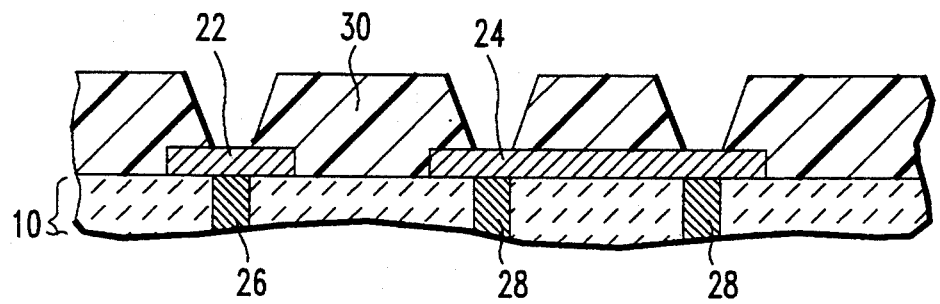
Figure 4C:
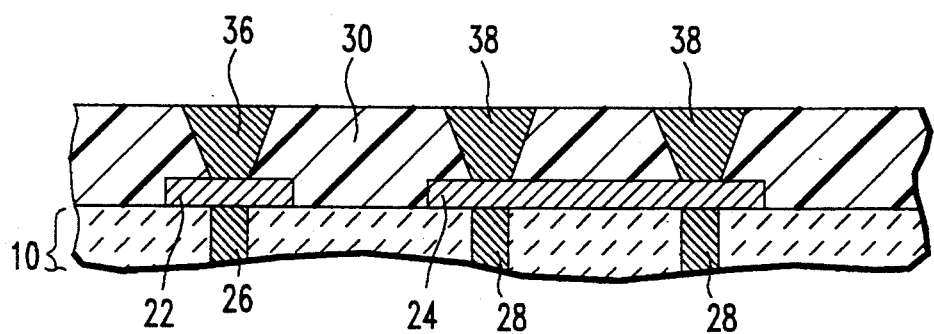
Figure 4D:
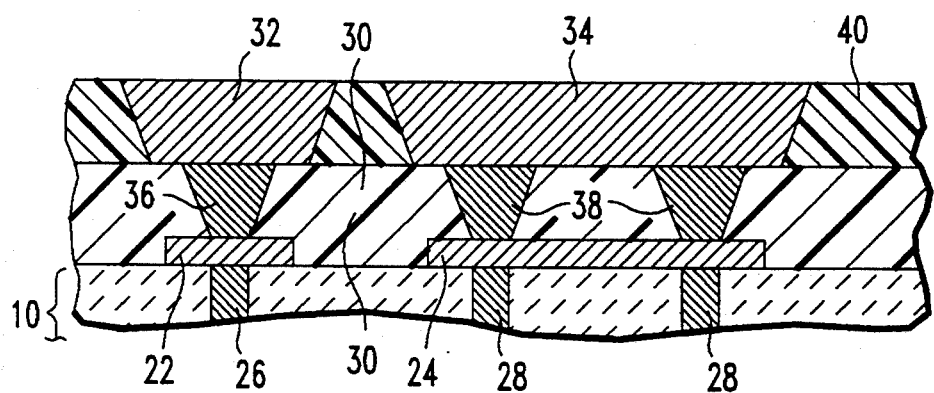
Figure 4E:
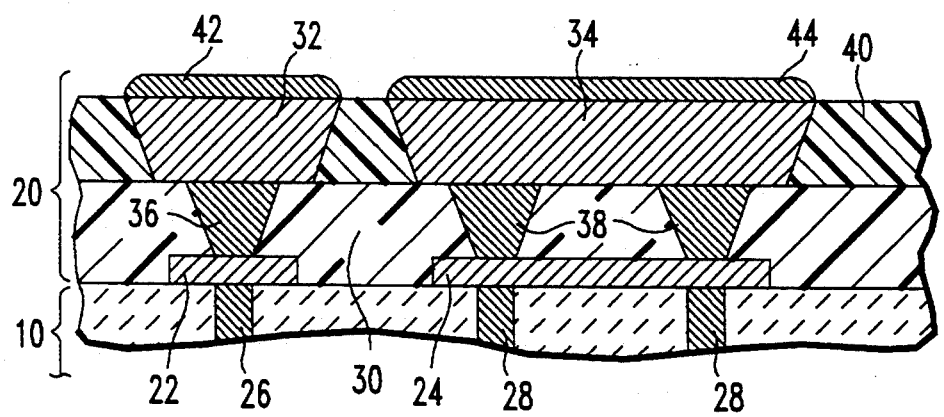

The structure of FIG. 2 may be made by a number of different processes. One set of process steps is illustrated in FIGS. 4A to 4E. On top of substrate 10, an adhesion layer of chromium followed by copper and then chromium again is deposited and then subtractively etched to form capture caps 22, 24 as shown in FIG. 4A. Then a layer of polyimide 30 (about 15 to 20 microns thick) is deposited over capture pads 22, 24 and patterned to form vias as shown in FIG. 4B. Referring now to FIG. 4C, blanket metallization consisting of chromium, then phased-in chromium/copper is deposited and planarized (to remove the excess metallization) to form studs 36, 38. In a similar manner, a 3 to 5 micron thick layer of polyimide is deposited and patterned to form second polymeric layer 40 and then chromium followed by chromium/copper metallization is deposited and planarized to form bonding pads 32, 34. The interconnection structure so far is illustrated in FIG. 4D. Finally, caps 42, 44 of nickel(P) or cobalt(P) followed by gold are deposited by electroless plating at a thickness of 1 to 2 microns to form the final interconnection structure 20 as shown in FIG. 4E.

The process steps for making the embodiment of FIG. 3 are illustrated in FIGS. 5A to 5F. Process steps illustrated in FIGS. 5A to 5D are identical to that previously illustrated and discussed with respect to FIGS. 4A to 4D and so will not be further discussed. The remaining portion of the interconnect structure of FIG. 3 is made by a liftoff process. In this process, a 3 to 5 micron third layer of polymeric material 50 (preferably a polyimide) is deposited over the second layer of polymeric material 40 and bonding pads 32, 34. Then a layer of soluble polymeric material 56, soluble for example in hot NMP solvent, is deposited over third polymeric material 50 followed by a RIE (reactive ion etch) barrier 58 and then patterned to result in the structure shown in FIG. 5E. The total thickness of soluble polymeric material 56 and RIE barrier 58 should be about 4 to 8 microns. Suitable metallization may then be blanket deposited after which the excess metallization is lifted off by dissolving the soluble polymeric material 56 to result in the interconnect structure 20' of FIG. 5F. Caps of metallization 42', 44' protrude above the third layer of polymeric material 50 and are now ready to accept pins (or other devices) at cap 44' and external pads at cap 42'.

The metallization for caps 42', 44' may be sequential layers of Cr/Cu/Ti/Mo/Au, Cr/Ni/Au, Cr/Ti/Au, Cr/Co/Au, Cr/Cu/Ni/Au or Cr/Cu/Co/Au. The caps 42', 44' protect the bonding pads 32, 34.

In either of the structures shown in FIGS. 2 and 3, the caps of metallization extend only about 1 to 2 microns above the level of the adjacent layer of polymeric material, enabling the bonding of pins or pads while protecting the underlying metallization from corrosion.

Figure 6:
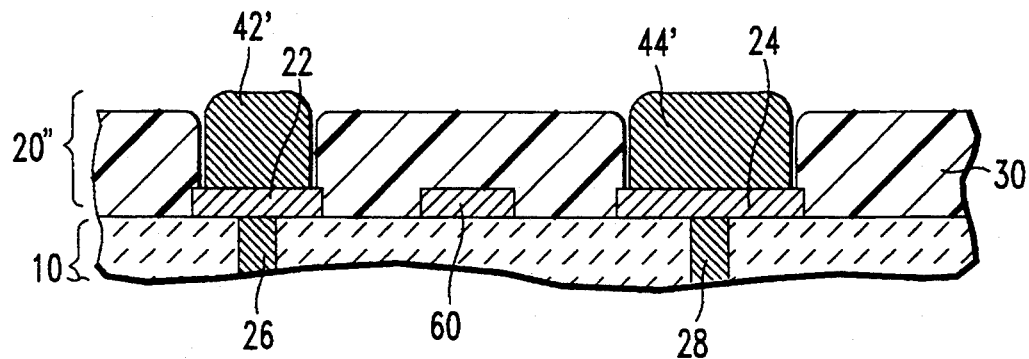
FIG. 6 is a cross sectional view of a third embodiment of the invention.

Referring now to FIG. 6, there is shown an alternative embodiment of the present invention. It should be understood that like numbers in the Figures refer to like elements. Substrate 10 has located thereon an interconnection structure 20". Contrary to the previously discussed embodiments of the invention, however, interconnection structure 20" provides for interconnection on the top surface of the substrate 10 as would be the case for interconnection of active or passive devices (not shown) to the substrate by solder or wire bonding or for making engineering changes to the internal wiring lines of the substrate 10. The interconnection structure 20" comprises capture pads 22, 24 and caps of electrically conducting metallization 42', 44'. One of the caps, 42' for example, may be used for solder connecting to a device while the other of the caps, 44' for example, may be used for wire bonding or engineering changes.

An important aspect of the embodiment of FIG. 6 is that caps 42', 44" only partially cover capture pads 22, 24, respectively. Thus, when layer 30 of polymeric material, preferably a polyimide, is applied, the underlying capture pads 22, 24 are protected from the environment. Thus, the optimum metallization for capture pads 22, 24 and for thin film wiring line 60 may be chosen with the necessary electrical and mechanical characteristics in mind and without regard to corrosion concerns caused by the environment. This important aspect of the invention also has applicability to the FIG. 3 embodiment (as well as to the FIG. 7 embodiment to be discussed hereafter) of the present invention. There, caps 42', 44' were smaller than bonding pads 32, 34. In general, the caps of metallization will only partially cover the previous electrically conducting feature.

Again referring to FIG. 6, there is polymeric layer 30 disposed or deposited on substrate 10, portions of capture pads 22, 24 not covered by caps 42', 44' and wiring line 60. Polymeric layer 30 also surrounds caps 42', 44'. The caps of metallization 42', 44' preferably extend beyond the height of polymeric material 30 to allow for device solder connections or wire bonding. Another aspect of this embodiment of the invention is that the soldering or brazing alloy used to attach devices to the caps is isolated from, and does not react with, the wiring line 60.

Preferred metallization for caps of metallization 42', 44' are sequential layers of Cr/Cu/Ti/Mo/Au, Cr/Ni/Au, Cr/Ti/Au, Cr/Co/Au, Cr/Cu/Ni/Au or Cr/Cu/Co/Au.

Figure 8A:
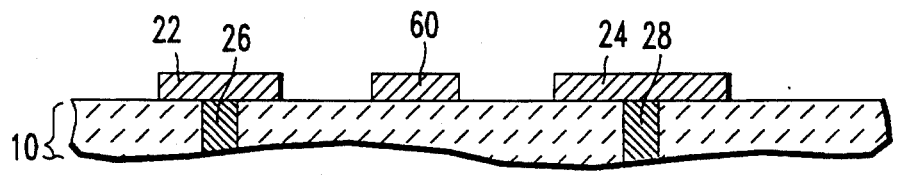
FIGS. 8A to 8D are cross sectional views illustrating the method for forming the third embodiment of the invention.
Figure 8B:
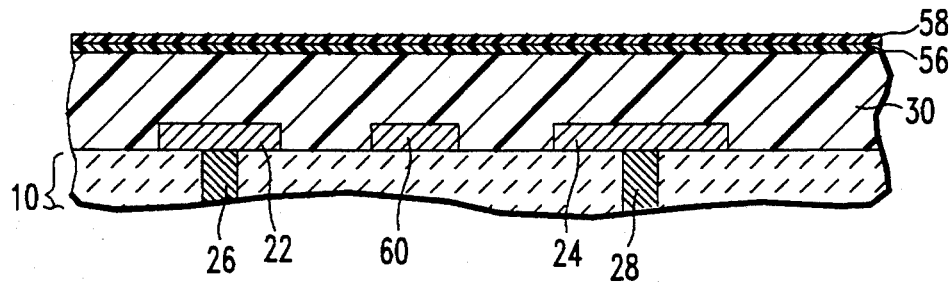
Figure 8C:
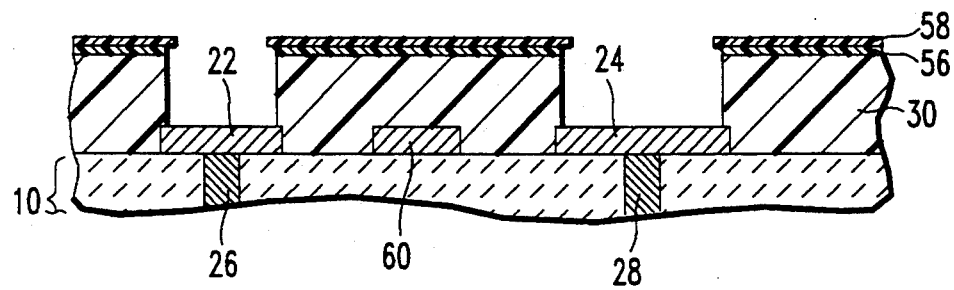

A preferred process for making the structure of FIG. 6 is illustrated in FIGS. 8A to 8D. On top of substrate 10, an adhesion layer of chromium followed by copper and then chromium again is deposited and then subtractively etched to form capture pads 22, 24 and thin film wiring line 60 as shown in FIG. 8A. The remaining part of the interconnect structure of FIG. 6 is made by a lift off process. Thus, a 3 to 5 micron thick layer of polymeric material 30, preferably a polyimide, is deposited over the capture pads 22, 24 and thin film wiring line 60. Then a layer of soluble polymeric material 56, soluble for example in hot NMP solvent, is deposited over polymeric material 30 followed by a RIE (reactive ion etch) barrier 58 and then patterned by laser ablation or any other photolithography method to result in the structure shown in FIG. 8C. The total thickness of soluble polymeric material 56 and RIE barrier 58 should be about 4 to 8 microns thick. Suitable metallization may then be blanket deposited. The thickness of the metallization is such that it should extend beyond soluble polymeric material 56 but not beyond RIE barrier 58. The excess metallization which had been deposited over RIE barrier 58 may be lifted off by dissolving the soluble polymeric material 56 to result in the interconnect structure 20'' of FIG. 8D. After the lift off, caps of metallization 42', 44' protrude about 1 to 2 microns above the layer of polymeric material 30 and are now ready for interconnection.

Figure 8D:
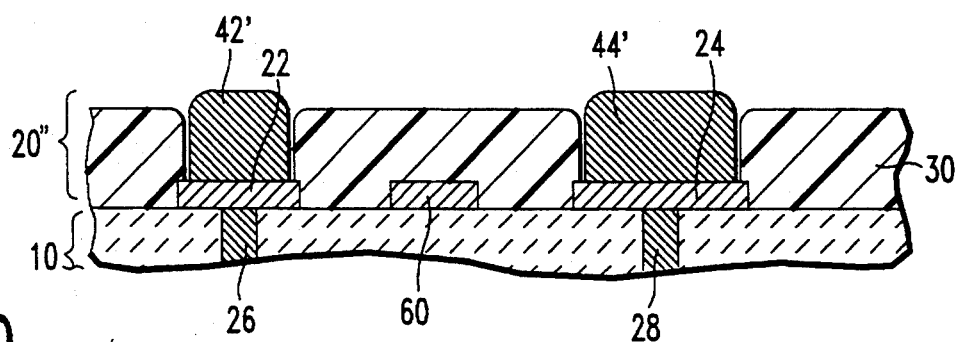

As can be seen from FIG. 8D, the cross sectional area of caps 42', 44' is less than the cross sectional area of capture pads 22, 24. Thus, the polymeric material 30 not only covers the edges of the capture pads 22, 24, it covers the periphery of the capture pads 22, 24 as well.

The metallization for caps 42', 44' may be sequential layers of Cr/Cu,Ti/Mo/Au, Cr/Ni/Au, Cr/Ti/Au, Cr/Co/Au, Cr/Cu/Ni/Au or Cr/Cu/Co/Au. The caps 42', 44' protect the capture pads 22, 24 and the thin film wiring line 60.

Figure 7:
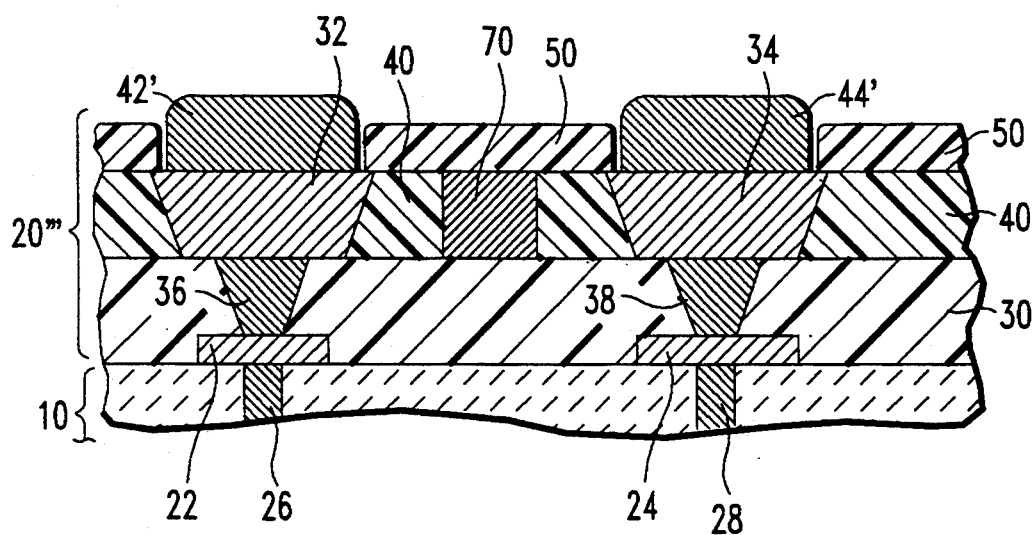
FIG. 7 is a cross sectional view of a fourth embodiment of the invention.

Referring now to FIG. 7, a final embodiment of the invention is illustrated. The FIG. 7 embodiment is essentially identical to the embodiment of FIG. 3 with two important exceptions. The first is that interconnection structure 20''' of FIG. 7 is for providing interconnection on the top surface of the substrate 10. The second is that interconnection structure 20''' contains thin film wiring line 70 which may be in second polymeric layer 40 (as shown) and/or in first polymeric layer 30 (not shown).

While not shown in FIGS. 6 and 7, there may be previously deposited wiring layers beneath the interconnection structures of FIGS. 6 and 7.

As noted previously, the preferred polymeric material for interconnected structures according to the invention illustrated in FIGS. 2, 3, 6 and 7, is a polyimide. Such polyimides can be selected from the class of low stress, low water absorbing polyimides such as BPDA-PDA, PMDA-ODA and the like. There is a class of polyimides known as photosensitive polyimides. These photosensitive polyimides are also preferred for use in the present invention because openings in the polymer coating can be produced by photoexposure and development processes without resorting to RIE processing.

Additionally, the openings in the polyimide layers can also be produced by ablating the layer using excimer laser radiation rather than by means of a RIE process. A plasma cleaning process to remove laser ablation debris is required to facilitate clean metal surfaces for contact to the next level of metallization.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An electrical interconnect structure comprising:
   at least one electrically conducting feature on a surface of a substrate;
   a cap of electrically conducting metallization on the electrically conducting feature wherein said cap only partially covers said electrically conducting feature; and
   a layer of polymeric material deposited on the surface of the substrate, on the electrically conducting feature not covered by said cap and around said cap, wherein said cap extends beyond the layer of polymeric material.

2. The interconnect structure of claim 1 further comprising at least a second electrically conducting feature, said second electrically conducting feature being totally enclosed within said layer of polymeric material.

3. The interconnect structure of claim 1 wherein the electrically conducting feature is a pad for joining to a semiconductor device.

4. The interconnect structure of claim 1 wherein the electrically conducting feature is selected from the group consisting of an engineering change and a wiring bonding pad.

5. The interconnect structure of claim 1 wherein said electrically conducting feature is a bonding pad for receiving an I/O pin or pad.

6. The interconnect structure of claim 1 wherein the cap of metallization is selected from the group consisting of sequential layers of nickel (P) and gold and cobalt (P) and gold.

7. The interconnect structure of claim 1 wherein the cap of metallization is selected from the group consisting of sequential layers of Cr/Cu/Ti/Mo/Au, Cr/Ni/Au, Cr/Ti/Au, Cr/Co/Au, Cr/Cu/Ni/Au and Cr/Cu/Co/Au.

8. An electrical interconnect structure comprising:
   at least one electrically conducting capture pad on a surface of the substrate;
   a first layer of polymeric material deposited on the surface of the substrate and the capture pad;
   at least one electrically conducting bonding pad deposited on the first layer of polymeric material;
   an electrically conducting stud connecting the capture pad and bonding pad through said first layer of polymeric material;
   a second layer of polymeric material deposited on the first layer of polymeric material and around the bonding pad, the polymeric material being at the same height as the bonding pad;
   a cap of electrically conducting metallization on the bonding pad extending beyond the second layer of polymeric material, the cap being of a different composition than the bonding pad; and
   further comprising a third layer of polymeric material deposited on the second layer of polymeric material and around the cap of metallization, the cap of metallization extending beyond the third layer of polymeric material.

9. The interconnect structure of claim 8 further comprising a wiring line enclosed within said first layer of polymeric material.

10. The interconnect structure of claim 8 further comprising a wiring line enclosed within said second layer of polymeric materials.

11. The interconnect structure of claim 8 wherein there are a plurality of capture pads and bonding pads.

12. An electrical interconnect structure comprising:
at least one electrically conducting capture pad on a surface of the substrate;
a first layer of polymeric material deposited on the surface of the substrate and the capture pad;
at least one electrically conducting bonding pad deposited on the first layer of polymeric material;
an electrically conducting stud connecting the capture pad and bonding pad through said first layer of polymeric material;
a second layer of polymeric material deposited on the first layer of polymeric material and around the bonding pad, the polymeric material being at the same height as the bonding pad;
a cap of electrically conducting metallization on the bonding pad extending beyond the second layer of polymeric material, the cap being of a different composition than the bonding pad;
wherein the bonding pads are principally copper; and
wherein the cap of metallization is selected from the group consisting of sequential layers of nickel(P) and gold and cobalt(P) and gold.

13. An electrical interconnect structure comprising:
at least one electrically conducting capture pad on a surface of the substrate;
a first layer of polymeric material deposited on the surface of the substrate and the capture pad;
at least one electrically conducting bonding pad deposited on the first layer of polymeric material;
an electrically conducting stud connecting the capture pad and bonding pad through said first layer of polymeric material;
a second layer of polymeric material deposited on the first layer of polymeric material and around the bonding pad, the polymeric material being at the same height as the bonding pad;
a cap of electrically conducting metallization on the bonding pad extending beyond the second layer of polymeric material, the cap being of a different composition than the bonding pad;
wherein the bonding pads are principally copper; and
wherein the cap of metallization is selected from the group consisting of sequential layers of Cr/Cu/Ti/Mo/Au, Cr/Ni/Au, Cr/Ti/Au, Cr/Co/Au, Cr/Cu/Ni/Au and Cr/Cu/Co/Au.

14. The interconnect structure of claim 11 further comprising at least one pad external to the substrate bonded to a cap of metallization on a bonding pad to form a pad-on-pad connection.

15. The interconnect structure of claim 14 further comprising at least one I/O pin bonded to a cap of metallization on a bonding pad to form a pin connection.

16. An electrical interconnect structure comprising:
at least two electrically conducting capture pads on a surface of the substrate;
a first layer of polymeric material deposited on the surface of the substrate and the capture pads;
at least two electrically conducting bonding pads deposited on the first layer of polymeric material wherein one bonding pad is larger than the other bonding pad;
an electrically conducting stud connecting each of the capture pads to a corresponding bonding pad through said first layer of polymeric material;
a second layer of polymeric material deposited on the first layer of polymeric material and around the bonding pads, the polymeric material being at the same height as the bonding pads;
a cap of electrically conducting metallization on each of the bonding pads extending beyond the second layer of polymeric material, the caps of metallization being of a different composition than the bonding pads.

17. The interconnect structure of claim 16 further comprising a third layer of polymeric material deposited on the second layer of polymeric material and around the caps of metallization, the caps of metallization extending beyond the third layer of polymeric material.

18. The interconnect structure of claim 16 further comprising a wiring line enclosed within said first layer of polymeric material.

19. The interconnect structure of claim 16 further comprising a wiring line enclosed within said second layer of polymeric material.

20. The interconnect structure of claim 16 wherein the bonding pads are principally copper.

21. The interconnect structure of claim 16 wherein the caps of metallization are selected from the group consisting of sequential layers of nickel(P) and gold and cobalt(P) and gold.

22. The interconnect structure of claim 17 wherein the bonding pads are principally copper.

23. The interconnect structure of claim 22 wherein the caps of metallization are selected from the group consisting of sequential layers of Cr/Cu/Ti/Mo/Au, Cr/Ni/Au, Cr/Ti/Au, Cr/Cu/Ni/Au and Cr/Cu/Co/Au.

24. The interconnect structure of claim 16 further comprising at least one pad external to the substrate bonded to the smaller of the bonding pads and the cap of metallization to form a pad-on-pad connection.

25. The interconnect structure of claim 24 further comprising at least one I/O pin bonded to the larger of the bonding pads and the cap of metallization to form a pin connection.

26. The interconnect structure of claim 16 wherein there are a plurality of capture pads and a plurality of the differently-sized bonding pads.

27. The interconnect structure of claim 26 further comprising a plurality of pads external to the substrate bonded to the smaller of the bonding pads and the caps of metallization and to form a plurality of pad-on-pad connections.

28. The interconnect structure of claim 27 further comprising a plurality of I/O pins bonded to the larger of the bonding pads and the caps of metallization to form a plurality of pin connections.

29. The interconnect structure of claim 28 wherein the plurality of pad-on-pad connections are located around the periphery of the surface of the substrate and the plurality of pin connections are located in a generally central portion of the surface of the substrate.

30. The interconnect structure of claim 16 wherein there are a plurality of electrically conducting studs connecting at least one capture pad to its corresponding bonding pad.

* * * * *